United States Patent [19]

Bodenstab

[11] Patent Number: 4,703,457

[45] Date of Patent: Oct. 27, 1987

[54] REGISTER CIRCUIT USED TO LOAD, HOLD, AND DUMP DIGITAL LOGIC SIGNALS

[75] Inventor: Paul R. Bodenstab, Ft. Collins, Colo.

[73] Assignee: Hewlett-Packard Company, Palo Alto, Calif.

[21] Appl. No.: 854,375

[22] Filed: Apr. 21, 1986

[51] Int. Cl.[4] .............................................. G11C 7/00
[52] U.S. Cl. .................................................... 365/189
[58] Field of Search .............................. 365/189, 230

[56] References Cited

U.S. PATENT DOCUMENTS 4,437,171  3/1984  Hudson et al. ...................... 365/177
4,570,244  2/1986  Sud et al. ............................ 365/230

Primary Examiner—James W. Moffitt
Attorney, Agent, or Firm—Bloor Redding, Jr.

[57] ABSTRACT

A register sub-circuit for a logic system is described which is capable of loading a logic signal from a bus, holding the state of the logic signal, and dumping the logic signal onto a precharged high capacitance bus. The circuit is master/slave in operation permitting the register to simultaneously dump the current contents of the register at the same time a new value is being loaded into the register. The circuit operates with a single phase clock. The circuit is easily integratable. The circuit comprises a storage sub-circuit and one or more dump sub-circuits. The circuit presents a low capacitance load to the dump control line.

5 Claims, 2 Drawing Figures

REGISTER CIRCUIT USED TO LOAD, HOLD, AND DUMP DIGITAL LOGIC SIGNALS

BACKGROUND

This invention relates to the field of art pertaining to electronic circuits used to load, hold, and dump digital logic signals.

In large complex digital systems, and in particular computers, data and temporary results are stored in registers while the system performs operations on the data or takes action based on the data. In these systems, busses are typically used to transfer data between these registers. These busses may be local or global depending on the distance between the source and destination registers. Global busses in particular due to their long length usually have high capacitance and the registers connected to them must be capable of driving this high capacitance in order for the system to operate at high speeds. In computer systems, registers are often quite wide, for many modern computers, 32 bits wide. For high performance, the register must be designed to dump its contents to a bus or load new contents from a bus in a minimum period of time and with minimum control line signal skew.

When large digital systems are transferred to silicon to form integrated circuits for lower cost and higher performance, the registers must be formed in an expedient manner. Registers in integrated circuits are typically formed out of register sub-circuits, which are combined and cascaded to form registers. Register sub-circuits add additional constraints on the construction of registers. Register sub-circuits should be regular in shape for easy replication. Register sub-circuits also must be designed to consume a minimum amount of power since heat dissipation is a serious problem for any VLSI integrated circuit and especially for sub-circuits which are replicated many times. Busses in these VLSI integrated circuits are typically precharged because it is easier and more economical for one circuit to charge the bus to a high voltage level while several independent circuits can be controlled to selectively discharged the bus to a low voltage level.

Register sub-circuits typically consist of two parts, a storage sub-circuit and a dump sub-circuit. The storage sub-circuit is a two state device used to hold the state of an input upon the occurrence of a load signal. The dump sub-circuit transfers the contents of the storage sub-circuit to an output bus upon the occurrence of a dump signal.

Prior art storage sub-circuits typically consisted of two inverters cascaded to form a latch. Prior art dump sub-circuits typically followed one of two approaches. The first approach connected the storage sub-circuit through a pass switch to the system bus. The second approach gated the dump signal and a signal representing the contents of the storage sub-circuit through a NOR gate and used the output signal to drive a bus pulldown switch. The first approach may be too slow and, under certain circumstances, may allow the contents of the storage sub-circuit to change while dumping into a high capacitance bus thereby causing an error. The second approach consumes considerable power in a system with many registers, since the NOR gates of all of the other inactive registers are in their active, high power consumption state. Both approaches require either large transistors for the pass switches or pull down switches to maximize performance. These large transistors have large capacitive loads on their gates. The control lines which drive these transistors have high resistance due to the length of the control line when multiple register sub-circuits are cascaded together. The resistors and capacitors present a large distributed resistive and capacitive load to the dump signal line. This causes considerable distortion and skew of the dump signal waveform as it propagates from one end of the register to the other thereby limiting the maximum operating frequency or maximum bus length in a digital system. Also, both of the prior art dump circuits begin to drive the precharged bus relatively late in the system timing. Usually, the signal which drives the dump or pass switch is generated from a clock signal and thus the output signal is delayed from the leading edge of the clock signal by the propagation time of a gate or the switching time of the pass switch. Further delay and skew of the output signal to the register is caused by the delay of the dump signal as it propagates down the dump signal line in a multiple bit register. Therefore, the precharged bus does not begin to discharge until considerably after the leading edge of the clock signal. This too serves to limit the maximum operating frequency or the maximum bus length of the integrated circuit.

What is needed is a register sub-circuit design with a regular design which has high performance outputs for high capacitance busses and which consumes low DC power. The register sub-circuit should also minimizes delay and skew of the output signal when dumping its contents to the system bus for maximum system performance.

SUMMARY

In accordance with the preferred embodiment of the present invention, a register sub-circuit for use in a logic system is described which is capable of loading a logic signal from a bus, holding the state of the logic signal, and dumping the logic signal onto a precharged high capacitance bus. The register sub-circuit may be easily combined to form a n-bit register. The register operates in a master/slave configuration permitting the register to simultaneously dump the current contents of the register while at the same time load a new value into the register. The register operates with a single phase clock. The register sub-circuit differs from the prior art in that it consumes very little DC power and only small amounts of AC power while being capable of driving high capacitance busses with minimum delay and skew. The circuit is easily integratable.

The present invention is superior to the prior art in several ways. First, the register sub-circuit requires less power than prior art designs since it requires only two loads per register sub-circuit for both storage and dump functions. Second, it is easy to cascade additional dump sub-circuits onto the storage sub-circuit in order to expand the register sub-circuit's ability to dump to two or more busses. Adding more dump sub-circuits to the register sub-circuit does not increase the DC power consumption of the register sub-circuit. Third, when the register sub-circuit is reproduced to form multiple bit registers, the distributed resistance and capacitance of the dump control line is considerably less than the prior art designs. This permits higher operating frequencies. Finally, the dump sub-circuit permits the discharge of the precharged bus with the leading edge of the clock signal, which is earlier than many of the prior art designs.

DESCRIPTION OF THE PREFERRED EMBODIMENT

Figure 1:
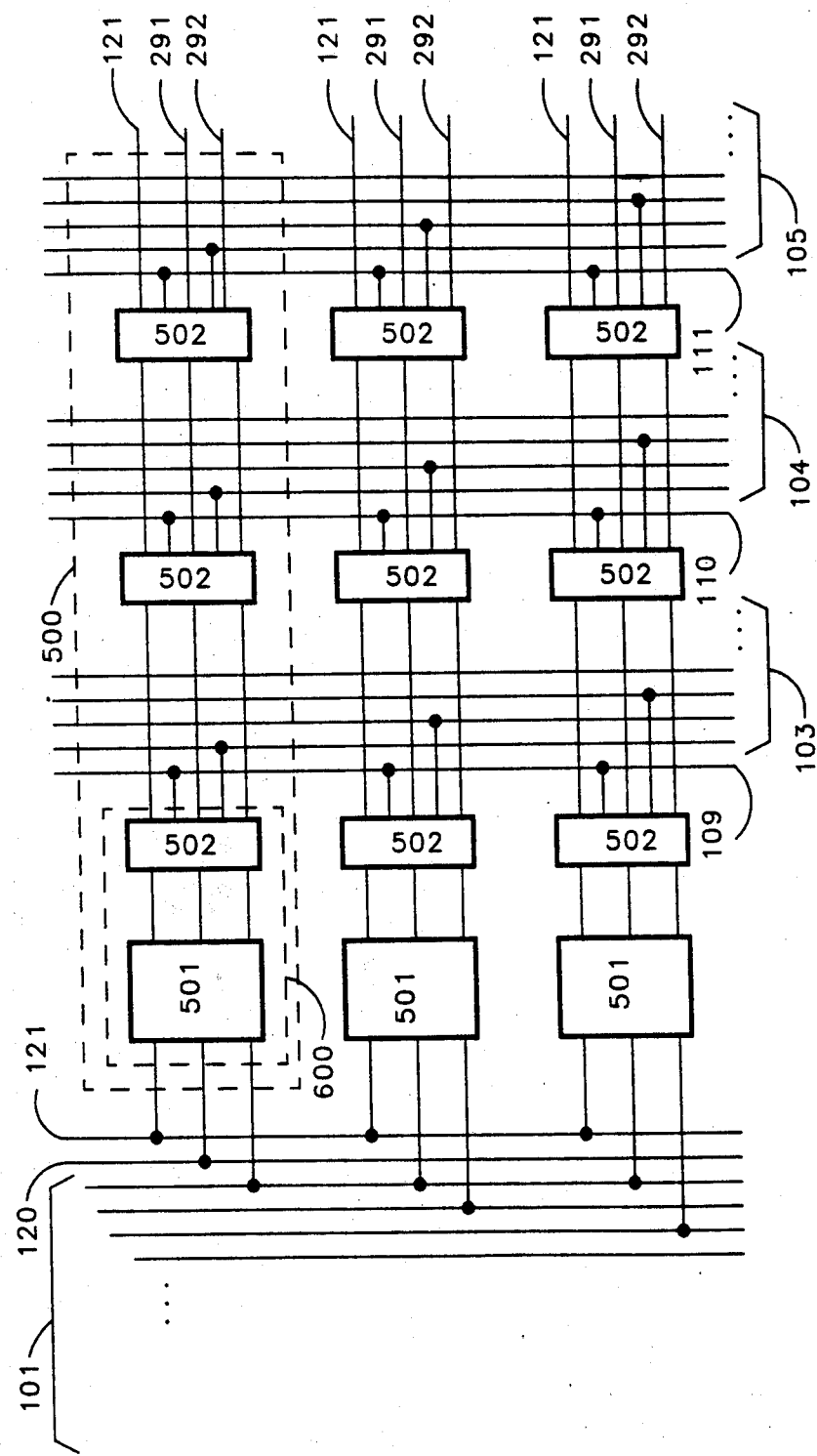
FIG. 1 is a block diagram of a register employing a register sub-circuit in accordance with the preferred embodiment of the present invention.

FIG. 1 is a block diagram of a register employing a register sub-circuit in accordance with the preferred embodiment of the present invention. The register as shown is three bits wide, but can be any width required by the designer. The register attaches to a n-bit wide data bus 101 and drives three n-bit wide output busses 103, 104 and 105. The register is controlled with a clock signal 121, a load signal 120 which signals when data is to be loaded from the data bus 101 into the register, and three dump signals 109, 110 and 111 which signal when the register contents are to be dumped to their respective output busses 103, 104 and 105. The register comprises three register sub-circuits 500. Each register sub-circuit 500 comprises a storage sub-circuit 501 and three dump sub-circuits 502, one for each output bus 103, 104 and 105. The construction and operation of the register can be observed from the register sub-circuit 600 which contains a storage sub-circuit 501 and only one dump sub-circuit 502. The components within the register sub-circuit, the storage sub-circuit 501 and dump sub-circuit 502, are designed to permit the sub-circuits to be cascaded in order to form n-bit wide registers capable of driving m output busses where n and m are positive integers. The circuit operates at two voltage levels, a high and low voltage level, which corresponds to true and false logic states respectively.

Figure 2:
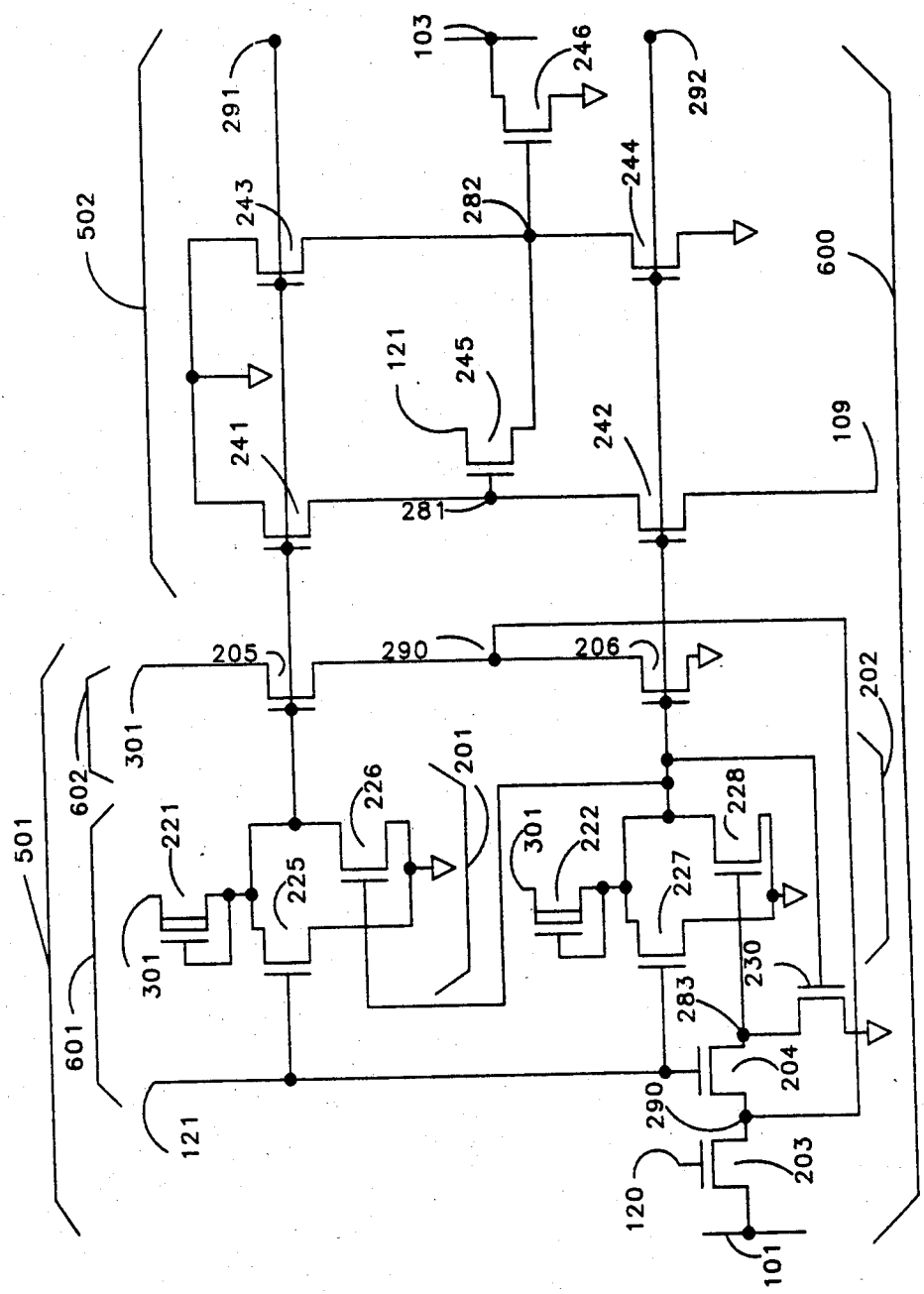
FIG. 2 is a schematic of a register sub-circuit in accordance with the preferred embodiment of the present invention.

Integration of the register sub-circuit is essential in large digital systems. The schematic diagram in FIG. 2 shows an embodiment of the present invention for a large digital system implemented in NMOS technology. Other technologies are equally useable and may be easily designed based on FIG. 2. The circuit is constructed as described below from fourteen or fifteen enhancement mode FETs and two depletion mode FETs.

FIG. 2 is a schematic of a register sub-circuit in accordance with the preferred embodiment of the present invention. The register sub-circuit 600 has four input signals: a data signal 101, a load signal 101, a load signal 120, a clock signal 121 and a dump signal 109. The register sub-circuit 600 has three output signals: output bus 103, signal 291 and signal 292. Additional output busses may be obtained by cascading dump sub-circuits 502 as described above onto signals 291 and 292. Power is supplied to the register sub-circuit 600 by Vdd signal 301. The register sub-circuit 600 comprises a storage sub-circuit 501 and a dump sub-circuit 502. The regular structure of the dump sub-circuit 502 permits easily replication of the dump sub-circuit 502 to drive multiple busses from a single storage sub-circuit 501.

The storage sub-circuit 501 comprises a latch 601, a buffer 602, and a load switch 203. The latch 601 accepts an input signal from node 290 and the clock signal 121 and generates two output signals 291 and 292. The latch 601 has a storage node 283. The latch 601 comprises two loads 221 and 222 and four switches 225 to 228 configured to form two NOR gates 201 and 202 and one switch 204 and an optional switch 230. The switch 204 is controlled by the clock signal 121 and when activated connects the storage node 290 to the storage node 283. The storage node 283 is one of the inputs to the second NOR gate 202. The clock signal 121 is also connected to one input of both NOR gates 201 and 202. The output signal of the second NOR gate 202 is connected to the other input of the first NOR gate 201. The outputs 291 and 292 of NOR gates 201 and 202 are the outputs of the latch. The optional switch 230 is employed to prevent the parasitic capacitance present between nodes 290 and node 283 from coupling the rising edge of node 290, caused by the falling edge of the clock signal 121 through switch 227, to node 283 thereby changing a low voltage level in node 283 to a high voltage level. Otherwise, when node 283 is at a low voltage and the clock signal falls, the state of the storage node may change to a high voltage level, causing an error. Since the rise time of signal 292 is considerably faster than the rate at which node 283 can be coupled high, optional switch 230 clamps node 283 to the low voltage level thereby preventing any problems.

The outputs of the latch 601 drive the buffer 602. The buffer 602 drives storage node 290 which is fed to the input of the latch 601. This permits the refreshing of storage node 283 when the load signal 120 is at a low voltage level. The storage node 290 has a considerably larger charge holding capacity than storage node 283. The buffer consists of two switches 205 and 206 which alternatively connect the storage node 290 to high voltage potential or low voltage potential depending on the output signals 291 and 292 of the latch 601. The input signal 101 to the storage sub-circuit 501 is fed through switch 203 to the storage node 290. The switch 203 is connected to the load signal 120.

The dump sub-circuit 502 comprises six switches 241 through 246. The dump sub-circuit requires two input signals 291 and 292 from the storage sub-circuit 501, a clock signal 121 being the same clock signal used by the storage sub-circuit 501, and a dump signal 109. The output of the dump sub-circuit 502 drives bus 103. The bus 103 may be a local or global bus. In the preferred embodiment of the present invention, the bus 103 is precharged to a high voltage level and the dump sub-circuit 502 of the preferred embodiment need only discharge the bus 103 when the dump signal 109 is high voltage and the state of the storage node 283 in sub-circuit 501 is a low voltage level. Switch 246 is used to discharge the precharged output bus 103. Switches 241 and 243 are controlled by the signal 291. Switches 242 and 244 are controlled by the signal 292.

The switches of this circuit being implemented by FETs cause certain nodes, including the storage nodes 281, 283 and 290, to operate between ground potential and the FET threshold voltage below Vdd. These voltages are still considered a high voltage level for purposes of the operation of this circuit.

The operation of the circuit is as follows. The circuit is controlled by a single clock signal 121 having high and low voltage levels. Using the clock signal 121, operation of the register sub-circuit may be conveniently divided into four distinct regions: the clock signal at a high voltage level, the transition of the clock signal from a high voltage level to a low voltage level (falling edge), the clock signal at a low voltage level, and the transition of the clock signal from a low voltage level to a high voltage level (rising edge).

When the clock signal 121 is at a high voltage level, the outputs 291 and 292 of NOR gates 201 and 202 are at a low voltage level and nodes 281 and 282 are isolated, their voltage level state being held by the parasitic capacitance of the node. If the load signal 120 is at a high voltage level, then storage nodes 290 and 283 will become the same voltage level as that of input signal 101 thereby loading these storage nodes with a new value. If the load signal 120 is at a low voltage level, then storage node 290 refreshes storage node 283 by sharing the charge between the parasitic capacitance of nodes 290 and 283. Since storage node 290 has considerably larger charge holding capacity, it can easily charge storage node 283 without significantly affecting its level.

When the clock signal 121 transitions from a high voltage level to a low voltage level, the falling edge of the clock signal isolates the charge stored on node 283 from the remainder of the register. If node 281 was at a high voltage level during the previous operating region, then the node 282 will be pulled low through switch 245 and the falling edge of the clock signal 121 thereby turns off switch 246. If the node 281 was previously at a low voltage level, the node 282 will remain at a low voltage level and keep switch 246 off.

When the clock signal 121 is at a low voltage level, NOR gates 201 and 202 serve to refresh the contents of the storage node 290 based on the state of storage node 283. With the clock signal 121 at a low voltage level, nodes 291 and 292 are complements of each other. Switches 205 and 206 regenerate on node 290 the same level as on node 283. Since either node 291 or 292 will be at a high voltage level, either switch 243 or 244 will be on causing node 282 to be actively held at a low voltage level keeping the bus pulldown switch 246 off. With the clock signal 121 at a low voltage level, the voltage level of node 281 depends on the state of the dump signal 109 and the state of the storage sub-circuit as appears on nodes 291 and 292. When the storage sub-circuit is at a high voltage level (i.e. node 283 is at a high voltage level), the pull down switch 246 of the dump sub-circuit 501 will remain off. No action by the register sub-circuit is required since the precharged bus 103 is already at a high voltage level. If storage node 283 is at a high voltage level, then node 292 will be at a low voltage level and node 291 will be at a high voltage level. This results in nodes 281 and 282 being set to a low voltage level by switches 241 and 243. Similarly, if node 283 is at a low voltage level, then node 292 will be at high voltage level and node 291 will be at low voltage level. The resulting level of node 281 then depends on the voltage level of the dump signal 109. If the dump signal 109 is at a high voltage level, then a charge will be stored on node 281 which will enable the bootstrapping action described below with the rising edge of the clock signal 121. If the dump signal 109 is at a low voltage level, then node 281 will remain at a low voltage level preventing any bootstrapping action which might occur on the rising edge of clock signal 121.

When the clock signal 121 transitions from a low voltage level to a high voltage level, the rising edge of the clock signal forces the output signals of both NOR gates 201 and 202 to go to a low voltage level turning off switches 241 through 244. This isolates nodes 281 and 282; their voltage level being determined by the charge stored in the parasitic capacitance of these nodes during the previous operating region. If the previous voltage level of the node 281 was at a low voltage level, which corresponds to the case when the register is not to be dumped or when the register is to be dumped but the state of the register is a high voltage level as determined by node 283, then switches 245 and 246 will remain off leaving the precharged bus 103 unchanged. However, if the voltage level of node 281 during the previous operating region was a high voltage level, which corresponds to the case when the register is to be dumped and the state of the register is a low voltage level as determined by node 283, then the rising edge of the clock signal 121 is conducted through switch 245 activating switch 246 which begins discharging the precharged bus to a low voltage level. The discharge of the precharged bus begins with the rising edge of the clock signal which is sooner than the prior art methods allowed. The rising edge of the clock signal 121 also starts either the set or refresh of the storage node 283 as described above.

What is claimed is:

1. A circuit for storing the logic state of a data signal, responsive to a load signal and a clock signal and generating first and second output signals, each signal having a first and second voltage level, the circuit comprising:
   first switching means responsive to the load signal for connecting the data signal to a first storage node having a first and second voltage level;
   second switching means responsive to the clock signal for connecting the first storage node to a second storage node having a first and second voltage level;
   a first NOR gate having an output connected to the first output signal and having first and second inputs connected to the second storage node and the clock signal;
   a second NOR gate having an output connected to the second output signal and having first and second inputs connected to the clock signal and the first output signal;
   third switching means responsive to the second output signal for setting the first storage node to the first voltage level; and
   fourth switching means responsive to the first output signal for setting the first storage node to the second voltage level.

2. A circuit as in claim 1 further comprising:
   fifth switching means responsive to the first output signal for setting the second storage node to the second voltage level.

3. A circuit for transferring first and second input signals to a precharged output bus responsive to a dump signal and a clock signal, the output bus and each signal having a first and second voltage level, the circuit comprising:
   first switching means responsive to the second input signal for setting a first storage node to the second voltage level;
   second switching means responsive to the second input signal for setting a second storage node to the second voltage level;
   third switching means responsive to the first input signal for connecting the first storage node to the dump signal;
   fourth switching means responsive to the first input signal for setting the second storage node to the second voltage level;

fifth switching means responsive to the first storage node for connecting the clock signal to the second storage node; and a sixth switching means responsive to the second storage node for discharging the precharged output bus to the second voltage level.

4. A circuit for storing the logic state of a data signal responsive to a load signal and a clock signal and for transferring the stored logic state of the data signal to a precharged output bus responsive to a dump signal and the clock signal, the output bus, data, load, clock and dump signals each having a first and second voltage level, the circuit comprising:

first switching means responsive to the load signal for connecting the data signal to a first storage node having a first and second voltage level;

second switching means responsive to the clock signal for connecting the first storage node to a second storage node having a first and second voltage level;

a first NOR gate having an output signal and having first and second inputs connected to the second storage node and the clock signal;

a second NOR gate having an output signal and having first and second inputs connected to the clock signal and the output signal of the first NOR gate;

third switching means responsive to the output signal of the second NOR gate for setting the first storage node to the first voltage level;

fourth switching means responsive to the output signal of the first NOR gate for setting the first storage node to the second voltage level;

fifth switching means responsive to the output signal of the second NOR gate for setting a third storage node to the second voltage level;

sixth switching means responsive to the output signal of the second NOR gate for setting a fourth storage node to the second voltage level;

seventh switching means responsive to the output signal of the first NOR gate for connecting the third storage node to the dump signal;

eighth switching means responsive to the output signal of the first NOR gate for setting the fourth storage node to the second voltage level;

ninth switching means responsive to the third storage node for connecting the clock signal to the fourth storage node; and tenth switching means responsive to the fourth storage node for discharging the precharged output bus to the second voltage level.

5. A circuit as in claim 4 further comprising:

eleventh switching means responsive to the output signal of the first NOR gate for setting the second storage node to the second voltage level;

* * * * *